United States Patent
Mertol

Patent Number: 5,907,189
Date of Patent: May 25, 1999

[54] CONFORMAL DIAMOND COATING FOR THERMAL IMPROVEMENT OF ELECTRONIC PACKAGES

[75] Inventor: Atila Mertol, Cupertino, Calif.

[73] Assignee: LSI Logic Corporation, Milpitas, Calif.

[21] Appl. No.: 08/864,994

[22] Filed: May 29, 1997

[51] Int. Cl.$^6$ .............................. H01L 23/10; H01L 23/28
[52] U.S. Cl. ........................... 257/787; 257/77; 257/788; 257/789; 257/741; 257/706; 257/701; 257/738; 257/796; 257/712; 251/104
[58] Field of Search ..................................... 257/787, 712, 257/704, 717, 726, 723, 706, 713, 796, 975, 77, 719, 627, 701, 737, 738, 741, 788, 789

[56] References Cited

U.S. PATENT DOCUMENTS 5,218,215   6/1993   Liang et al. .............................. 257/712
5,608,267   3/1997   Mahulikar et al. ...................... 257/706

Primary Examiner—Alexander Oscar Williams

[57] ABSTRACT

One aspect of the invention relates to a method for providing a semiconductor package with a thermally conductive coating, the semiconductor package including a package substrate having a plurality of electrically conductive traces formed thereon, an upper surface and a lower surface, the lower surface having a plurality of contacts for providing electrical connection between the conductive traces formed on the package substrate and a plurality of conductive traces formed on a printed circuit board, and a semiconductor die mounted to the upper surface to the package substrate, the semiconductor die having a plurality of bond pads formed thereon which are electrically connected to the conductive traces formed on the package substrate. In one embodiment, the method includes the steps of depositing a coating on the upper surface of the package substrate and the coating includes a diamond film or diamond particles.

7 Claims, 4 Drawing Sheets

CONFORMAL DIAMOND COATING FOR THERMAL IMPROVEMENT OF ELECTRONIC PACKAGES

TECHNICAL FIELD

This invention relates generally to semiconductor packaging technology, and more particularly, to providing more efficient heat dissipation from semiconductor packages. Still more particularly, the invention relates to providing a high thermal conductivity attachment between a semiconductor device and a semiconductor package substrate so that heat is transferred laterally away from the device.

BACKGROUND OF THE INVENTION

The amount of heat generated by a semiconductor device, or chip, is related to the number of transistors on the device and the clock speeds at which they are operated. As more and more transistors are fabricated onto a single semiconductor device, the overall amount of heat generated by the device is increased. Similarly, the faster the transistors on the chip are operated, the more heat is generated by the device. Since advances in semiconductor fabrication technology continue to make possible both increased transistor density and higher clock speeds, the problem of heat generation is becoming increasingly severe, particularly in high performance devices which push the limits of fabrication technology.

As an increasing amount of heat is generated by the device, the junction temperatures of the transistors in the device increases proportionately. The failure rate of a semiconductor device is directly related to the junction temperature at which it is operated. The higher the junction temperature, the higher the failure rate.

It is generally known to provide a heat spreader or heat sink for a semiconductor device in order to transfer the generated heat away from the device itself and into the surrounding air, thus reducing the junction temperature. Heat sinks generally are located as physically close to the semiconductor device as possible in order to maximize the amount of heat transferred. Heat sinks typically are constructed from a high thermal conductivity material, such as copper, aluminum or high thermal conductivity plastic, and are designed to present a maximum amount of surface area to the ambient air in order to allow the heat generated by the semiconductor device to be removed, either by natural or forced convection.

One way that heat sinks increase the amount of surface available for heat dissipation is to provide a plurality of parallel cooling fins which rise vertically from a horizontal surface, or base member. One conventional heat sink is shown in FIG. 1. In this example, the heat sink 100 includes a base member 102, having a base surface 103 which is attachable to a corresponding surface of the semiconductor package. Heat sink 100 is also provided with a heat dissipating surface 105. In this case, the surface 105 includes fins 104a, 104b, 104c and 104d which provide greater surface area for convection cooling. Other designs include a plurality of cooling pins which rise from the base member. Numerous types of pins are known in the art having cross-sections of various shapes. Forced convection may be provided by a fan which passes air over a circuit board to which the packaged semiconductor is mounted, or, in some cases, a fan may be mounted directly onto the top of the heat sink fins themselves.

Regardless of the exact type of heat sink employed, modern semiconductor packaging technologies present numerous challenges to provide heat sinks, and methods for attaching heat sinks, in commercially practical applications. For example, one common type of package is the encapsulated package, shown in cross-section in FIG. 2. The particular encapsulated package shown is referred to as a ball grid array ("BGA"). In this case, the semiconductor die 200 is attached to a substrate 204 by a suitable adhesive, or die attach material 206. Substrate 204 is typically of laminar construction and various conductive paths are formed on individual layers. Electrical connection between the individual layers is provided by vias in the substrate. Electrical connection between the I/O bond pads on the die 200 and conductive paths provided on the substrate 204 is provided by bond wires 202. The conductive paths on substrate 204 are coupled to solder balls 208 which provide electrical connection to a printed circuit board ("PCB"). In order to protect the delicate bond wires 202, the chip is encapsulated with, for example, epoxy 210 to form what is sometimes referred to as a "glob-top." Similar encapsulated packages include, for example, pin grid array packages ("PGA") which provide cylindrical pins in place of the solder balls 208 shown in the figure.

Typically, the substrate 204 is constructed from either a ceramic material, in which case the package is referred to as a ceramic ball grid array ("CBGA"), or a plastic material, in which case the package is referred to as a plastic ball grid array ("PBGA"). While the ceramic substrates offer certain advantages over plastic substrates with respect to heat conductivity, mechanical strength and moisture resistance, plastic substrates are being increasingly used because of lower manufacturing costs and their ability to provide thinner overall packages. Moreover, advances in manufacturing have improved the plastic substrates relative to their ceramic counterparts. For example, improvements in sealing the laminar layers of the plastic substrates have made them almost as moisture resistant as ceramic substrates.

The thermal resistance to the heat transfer from the transistor junctions on the die to the ambient air is the sum of the thermal resistance in the junction-to-case thermal path and the case-to-ambient path. This is expressed as:

$$\theta_{JA} = \theta_{JC} + \theta_{CA}$$

where $\theta_{JA}$ is the total thermal resistance from the device junctions to the ambient, typically expressed in degrees Celsius per watt (° C./W), $\theta_{JC}$ is the thermal resistance of the heat transfer path from the device junctions to the case, and $\theta_{CA}$ is the thermal resistance of the heat transfer path from the case to the ambient. The thermal resistance of a heat transfer path is, in turn, a function of the thickness of the material which makes up the path divided by the product of a coefficient of thermal conductivity of the material and the area of the material. This is expressed as:

$$\theta = t/kA$$

where $\theta$ is the thermal resistance, t is the thickness of the material in the heat transfer direction, k is the coefficient of thermal conductivity of the material, and A is the cross-sectional area of the material layer normal to the heat transfer direction.

In general, the components used in manufacturing semiconductor packages have poor thermal properties. For example, although there is some variance between different types, epoxy, which is used to attach structures such as heat sinks, dam rings and heat spreaders, has a very low thermal conductivity. Thus, even if a heat sink is attached to a package, the thermal resistance of the epoxy reduces the efficiency of the heat transfer. A similar problem occurs with the encapsulant used to cover the semiconductor die in encapsulated semiconductor packages, such as that shown in FIG. 1.

Accordingly, it is an object of the present invention to provide a method and apparatus which overcomes the above mentioned problems. It is another object of the invention to provide a coating for semiconductor packages which improves heat transfer from the semiconductor die to the ambient. Still further objects and advantages of the present invention will become apparent in view of the following disclosure.

SUMMARY OF THE INVENTION

One aspect of the invention relates to a semiconductor package. In one embodiment of the invention, the package comprises a package substrate having a plurality of electrically conductive traces formed thereon, an upper surface and a lower surface, the lower surface having a plurality of contacts for providing electrical connection between the conductive traces formed on the package substrate and a plurality of conductive traces formed on a printed circuit board; a semiconductor die mounted to the upper surface of the package substrate, the semiconductor die having a plurality of bond pads formed thereon which are electrically connected to the conductive traces formed on the package substrate; and a coating disposed on the upper surface of the package substrate, the coating comprising diamond.

Another aspect of the invention relates to a method for providing a semiconductor package with a thermally conductive coating, the semiconductor package including a package substrate having a plurality of electrically conductive traces formed thereon, an upper surface and a lower surface, the lower surface having a plurality of contacts for providing electrical connection between the conductive traces formed on the package substrate and a plurality of conductive traces formed on a printed circuit board, and a semiconductor die mounted to the upper surface of the package substrate, the semiconductor die having a plurality of bond pads formed thereon which are electrically connected to the conductive traces formed on the package substrate. In one embodiment, the method comprises the steps of depositing a coating on the upper surface of the package substrate, in which the coating includes a diamond film or diamond particles.

DETAILED DESCRIPTION OF EMBODIMENTS OF THE INVENTION

Figure 1:
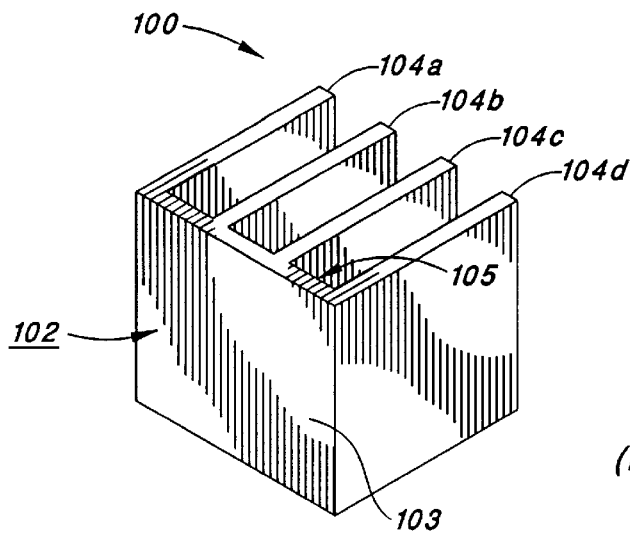
FIG. 1 is a perspective view showing a conventional heat sink for use with semiconductor packages.
Figure 2:
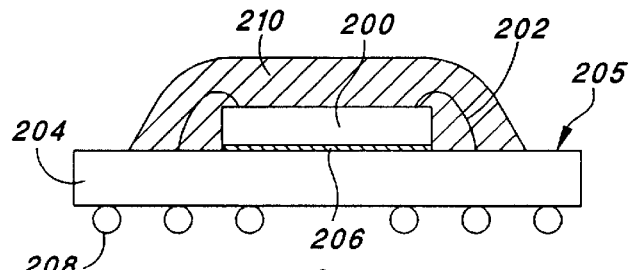
FIG. 2 is a cross-sectional view of a conventional encapsulated semiconductor package.
Figure 3:
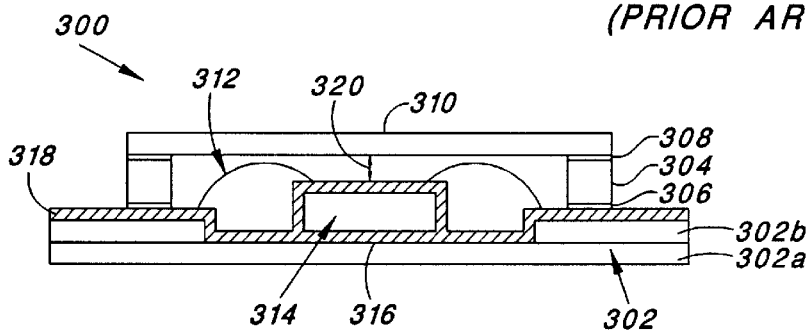
FIG. 3 is a cross-sectional view of a semiconductor package according to an embodiment of the invention.

Referring now to FIG. 3, there is shown a cross-sectional view of a semiconductor package 300 according to an embodiment of the invention. In this case, the package 300 comprises a package substrate 302 having a lower lamination 302a and an upper lamination 302b. A semiconductor die 314 is mounted to the lower lamination 302a of the package substrate 302 by a die attach material 316. Package substrate 302 is provided with a plurality of electrically conductive traces which are used to provide electrical connection between the semiconductor die 314 and a separate printed circuit board (not shown) to which the package 300 will be mounted in practical applications.

Bond pads on the semiconductor die 314 are connected to the electrically conductive traces on the package substrate 302 by bond wires 312, as is conventional in the art. In other embodiments, the bond pads on the semiconductor die 314 are connected to electrical contacts on the package substrate 302 via solder bumps disposed on the semiconductor die 314. This type of package is conventionally referred to as "flip-chip" packaging. A layer of diamond material 318 is disposed over the surface of the package substrate 302 and semiconductor die 314 as shown in the figure. A dam ring, or stiffener, 304 is then attached to the diamond layer 318 by dam ring attach epoxy 306. Finally, a metal plate 310 is attached to the dam ring 304 by lid attach epoxy 308. The metal lid 310 covers the semiconductor die 314 and bond wires 312, and also serves to dissipate the heat generated by the semiconductor die 314. In some embodiments, the area inside the metal lid 310, dam ring 304 and package substrate 302 is filled with an encapsulant epoxy such as "HYSOL," in order to protect the semiconductor die 314 and bond wires 312, and improve the thermal conductivity between the semiconductor die 314 and the metal lid 310.

The diamond coating 318 provides substantially improved thermal performance over conventional semiconductor packages. Specifically, in conventional packages the thermal transfer path between semiconductor die 314 and the metal lid 310 is generally in one direction, i.e., perpendicular to the active surface of the semiconductor die 314, as indicated by the arrow 320 shown in FIG. 3. Heat transfer through paths lateral to the semiconductor die 314 is negligible in conventional semiconductor packages.

Since the thermal resistance of a heat transfer path is inversely proportional to the area of the path, as discussed previously, the failure of conventional semiconductor packages to take advantage of lateral heat transfer restricts the area of the thermal transfer path to, essentially, the surface area of the active surface of the die 314. By reducing the effective area of the thermal transfer path, the thermal resistance of the heat transfer path is effectively increased.

In the embodiment of the invention shown in FIG. 3, the diamond coating 318 has an extremely high thermal conductivity. Thus, unlike conventional packages, the heat generated by the semiconductor die 314 not only moves in the direction indicated by the arrow 320, but also laterally across the upper surface of the package substrate 302. This effectively increases the area of the thermal transfer path to the surface area of the package substrate 302 and allows uniform temperature distribution across the package substrate. As will be clear by now, this increase in surface area greatly reduces the thermal resistance of the junction-toambient heat transfer path. Moreover, the efficiency of the metal lid 310 as a heat spreader is increased because, in addition to the heat transfer path 320, the lateral transfer of heat through the diamond coating 318 also allows a significant heat transfer path from the semiconductor die 314 through the dam ring 304 and up to metal lid 310 where it is removed by convective heat transfer.

For packages with a cavity and lid attachment, such as that shown in FIG. 3, the diamond coating is preferably deposited on the top surface of the device by covering the wire bond pads on the die surface, die side surfaces, cavity and the package substrate top surface. For good thermal conductance, the diamond film is deposited continuously having no gaps or breaks formed therein.

Figure 4:
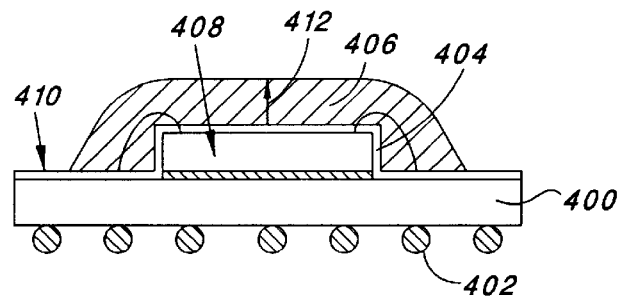
FIG. 4 is a cross-sectional view of a semiconductor package according to another embodiment of the invention.

Referring now to FIG. 4 there is shown a cross-sectional view of an embodiment of the invention useful in an encapsulated package. In this case, the semiconductor package comprises a substrate 400 having a plurality of solder balls, or pins, attached to its lower surface for mounting to a printed circuit board (not shown). A semiconductor die 408 is mounted to the upper surface of the package substrate 400. Bond wires 404 are provided to attach bond pads on the semiconductor die 408 to conductive traces on the package substrate 400. A diamond coating 410 is then disposed over the surface of the package substrate 400 and the semiconductor die 408. Finally, an encapsulant 406 is disposed over the semiconductor die 408 in the package substrate 400 in order to protect the bond wires 404 from damage. In a conventional encapsulated semiconductor package, the heat transfer path from the semiconductor die 408 to the ambient air is only in a direction normal to the active surface of the semiconductor die 408 as indicated by the arrow 412. However, according to this embodiment of the invention, the diamond coating 410 permits lateral transfer of the heat generated by semiconductor die 408 across the upper surface of the package substrate 400. Again, this dramatically increases the amount of surface area in the heat transfer path available to remove heat from the semiconductor die 408. The addition of an external heat sink would allow heat to be dissipated even more efficiently from the package to the surrounding environment as shown in FIG. 9.

Figure 9:
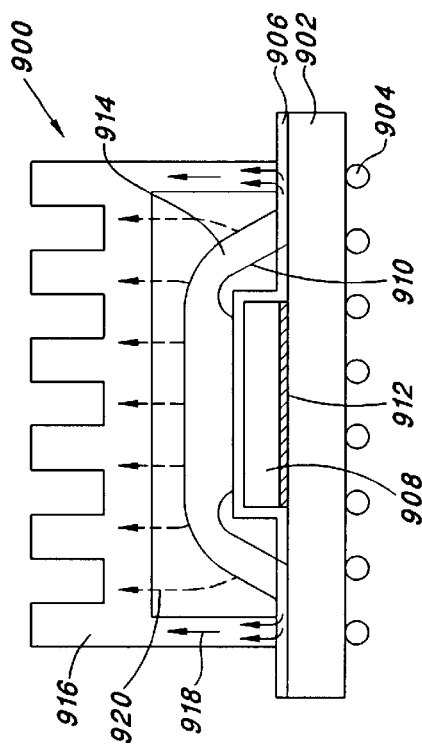
FIG. 9 is a cross-sectional view of a semiconductor package according to another embodiment of the invention.

In FIG. 9 there is shown a cross-sectional view of a semiconductor package according to still a further embodiment of the invention. In this embodiment, the package comprises a substrate 902 having a plurality of solder balls 904 formed on its lower surface for providing electrical connection to a printed circuit board (not shown). The upper surface of substrate 902 has a conformal diamond coating 906 formed thereon which covers the upper surface of substrate 902 and semiconductor die 908. Semiconductor die 908 is attached to package substrate 902 by die attach material 912 and an electrical connection is provided from the semiconductor die 908 to traces formed on the package substrate 902 by bond wires 910. The die 908 is covered by encapsulant 914. A heat sink 916 is attached to the package. In a conventional semiconductor package, i.e., no diamond layer is provided, the primary heat transfer path from the semiconductor die 908 to the heat sink 916 is shown by dashed arrows 920. This is undesirable due to the low thermal conductivity of the encapsulant 914.

By contrast, in the invention shown in FIG. 9 heat is carried laterally away from the semiconductor die 908 due to the extremely high thermal conductivity of the diamond coating 906. This allows a high thermal conductivity heat path to the heat sink 916 as shown by the solid arrows 918. Thus, the lateral heat path indicated by arrows 918 becomes the primary heat path to the heat sink 916 and the less efficient heat path shown by dashed arrows 920 becomes only the secondary heat path.

For encapsulated packages, such as that shown in FIG. 4, the encapsulation process preferably takes place after the diamond coating. Since the encapsulant has a very low thermal conductivity, the major heat dissipation path would be through the diamond coating.

Figure 5:
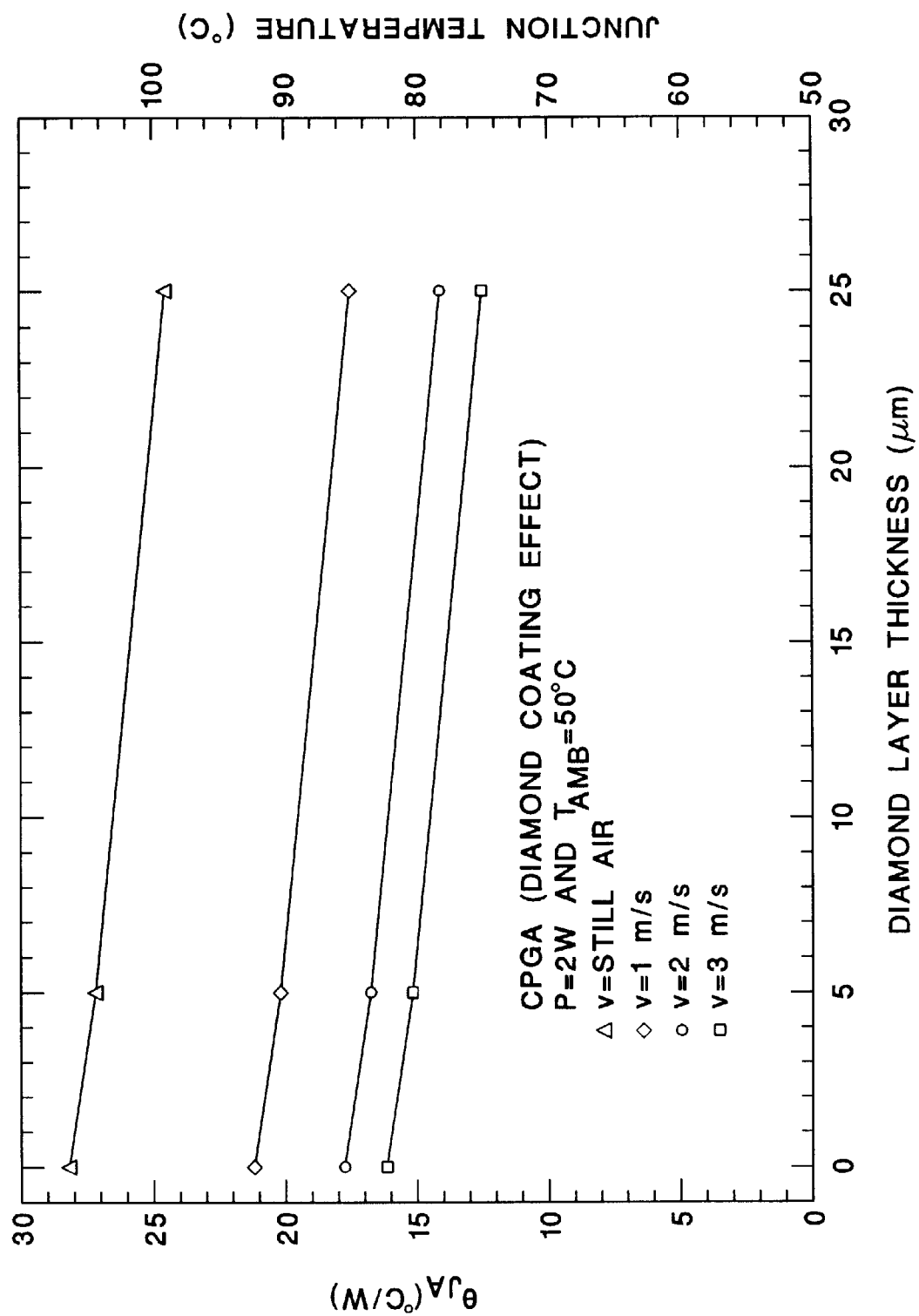
FIG. 5 is a chart illustrating the effects of a diamond layer coating for a ceramic semiconductor package according to an embodiment of the invention.
Figure 6:
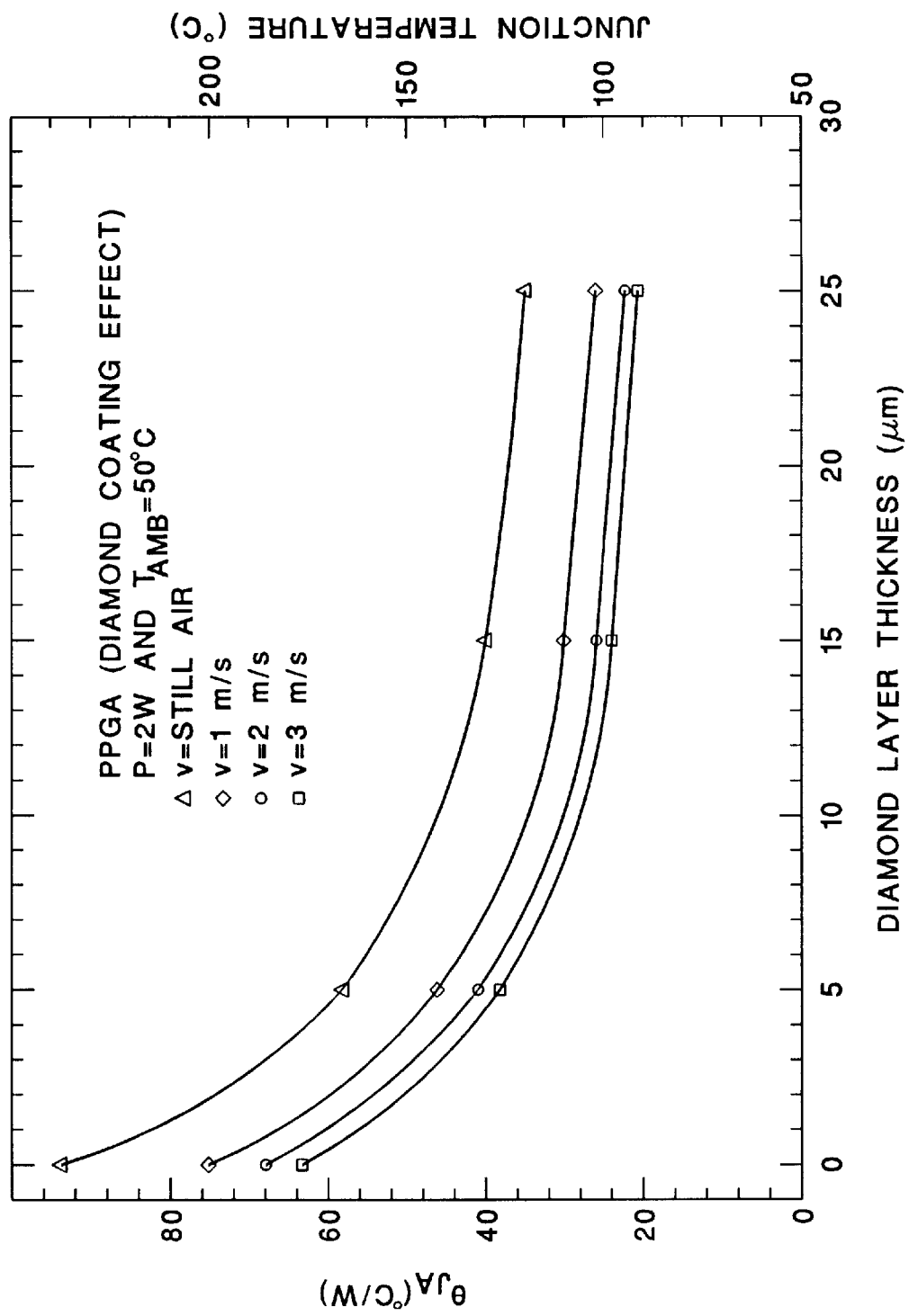
FIG. 6 is a chart illustrating the effects of a diamond layer coating on a plastic semiconductor package according to still a further embodiment of the invention.

FIGS. 5 and 6 illustrate the improvement in junction-to-ambient resistance for exemplary devices which are provided with a diamond coating according to embodiments of the present invention.

FIG. 5 is a graph illustrating the junction-to-ambient thermal resistance $\theta_{JA}$ (° C./W) and the junction temperature (° C.) as a function of the diamond coating thickness for a ceramic pin grid array ("CPGA") semiconductor package. Although a pin grid array is used in this example, similar results would be obtained for other packages. In this example, the CPGA package consumes 2 watts of power at an ambient temperature of 50° C. Thermal finite element simulations are performed for the CPGA operating in still air, and air moving at 1, 2 and 3 meters per second. It is seen from the chart that, for all air velocities, the junction temperature of the semiconductor die is reduced as the thickness of the diamond layer increases. The improvement in thermal performance is most appreciable as the thickness of the diamond layer increases from about 3 $\mu$m to about 15 microns ($\mu$m). As the thickness increases beyond 15 microns, the improvement continues, but at a slower rate.

FIG. 6 is a chart similar to the one shown in FIG. 5, but in this case the semiconductor package is a plastic pin grid array ("PPGA"). The improvement in performance in a plastic pin grid array is even more substantial than that in a ceramic package because the plastic package substrate has a lower thermal conductivity than a ceramic package substrate. In this case, it is seen that even a diamond coating as thin as 1 micron is sufficient to significantly lower the junction temperature of a semiconductor die. Again, the most dramatic improvement is found with a diamond layer up to about 10–14 microns in thickness. Afterwards, the thermal improvement increases with increasing thickness in the diamond layer, but at a slower rate.

Those of skill in the art will recognize that various suitable types of diamond are useful in the present invention, with diamond types having a relatively high thermal conductivity being preferred over diamond types having relatively low thermal conductivity. Examples of suitable diamond types are synthetic single crystal diamonds of type IIb, and isotopically pure (carbon-12) diamonds. The thermal conductivity of these diamond types, as well as others, have been extensively studied and are published in various scientific publications, such as G. M. Marinescu, *Thermal, Mechanical, Electrical and Physical Properties of Selected Packaging Materials* (part 17)", Center for Information and Numerical Data Analysis and Synthesis (1992), incorporated herein by reference.

Various techniques are known to provide a suitable diamond coating onto the semiconductor package. One technique, particularly useful with ceramic package substrates, is chemical vapor deposition ("CVD"). CVD techniques are well known, particularly in the semiconductor arts and will be only briefly discussed here.

Chemical vapor deposition involves a gas-phase chemical reaction occurring above a solid surface, which causes deposition onto the surface. CVD techniques for producing diamond films require a means of activating gas-phase carbon-containing precursor molecules. This generally involves thermal (e.g., hot filament) or plasma (D.C., R.F., or microwave) activation. While the methods differ in detail, they share common features. For example, growth of diamond (rather than deposition of other, less, well-defined forms of carbon) normally requires that the substrate be maintained at a temperature in the range of 1000–1400 K, and that the precursor gas be diluted in an excess of hydrogen (typical CH4 mixing ratio, approximately 1–2 vol %).

The surface morphology obtained during CVD depends critically upon the gas mixing ratio and the substrate temperature. Under slow growth conditions, i.e., low CH4 partial pressure and low substrate temperature, there is obtained a microcrystalin film, with triangular [111] facets being most evident, along with many obvious twin boundaries. [100] facets, appearing both as square and rectangular forms, begin to dominate as the relative concentration of CH4 in the precursor gas mixture, and/or the substrate temperature, is increased. Cross-sections through such microcrystalin films show the growth to be essentially columnar. At still higher CH4 partial pressures, the crystalin morphology disappears altogether and the film becomes an aggregate of diamond nanocrystals and disorder graphite. Such techniques are described in greater detail in, for example, M. N. R. Ashford, et al. *"Thin Film Diamond by Chemical Vapor Deposition Methods,"* Chem. Soc. Rev., 23 (1994) 21–30. It will be noted that with a CVD technique, the thickness of the diamond layer should be a minimum of approximately 13 microns to ensure that the diamond layer is self-supporting.

While CVD techniques can deposit high quality, self-supported diamond films of any desired thickness onto a package substrate, they also operate only at high temperatures, e.g., 700° C., and are thus ill-suited for use with plastic substrates, or substrates in which the semiconductor die has already been attached to the substrate with a low melting point solder or epoxy.

Figure 7:
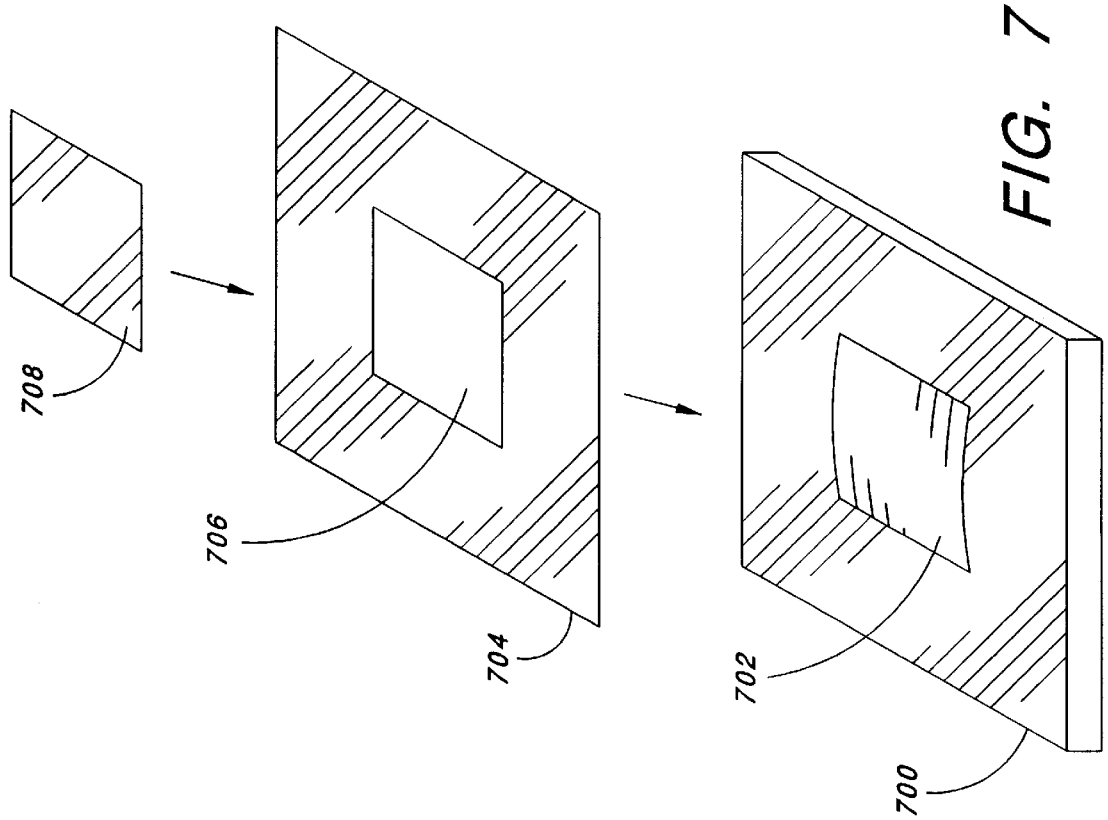
FIG. 7 is an exploded diagram illustrating a semiconductor package according to an embodiment of the invention.

Thus, according to another embodiment of the invention, free-standing diamond structures are fabricated apart from the semiconductor, into suitable shapes, then attached to the semiconductor package. FIG. 7 shows an exploded diagram of a semiconductor package according to this embodiment of the invention. In this case, the package comprises a substrate 700 having a die connection region 702 formed thereon. A thin wafer-like diamond structure 704 is constructed to substantially cover the upper surface of the package substrate 700. The diamond structure 704 has an opening 706 formed therein so that the die may be mounted to the upper surface of the package substrate 700. An additional diamond structure 708 is formed to cover the upper surface of the encapsulated region 702 after the package is assembled, if desired. Attachment of the diamond structures 704 and 708 to the package substrate is performed by, for example, applying an adhesive material to the package substrate.

Still a further technique for applying the diamond film to the semiconductor package involves suspending a plurality of diamond particles in an adhesive binder then applying the binder onto the semiconductor package, for example, by spraying. Various known epoxies are suitable for this purpose, such as "HYSOL". Those of skill in the art will be able to select suitable epoxies based upon individual criteria related to the method of application and the thermal conductivity of the binder. Of course, in this embodiment the beneficial effects of the high thermal conductivity of diamond are reduced due to the presence of the binder. Alternately, diamond particles can be applied to the semiconductor packages through dry powder application techniques, although care will be required if such techniques involve electrostatic attachment of the particles.

Figure 8:
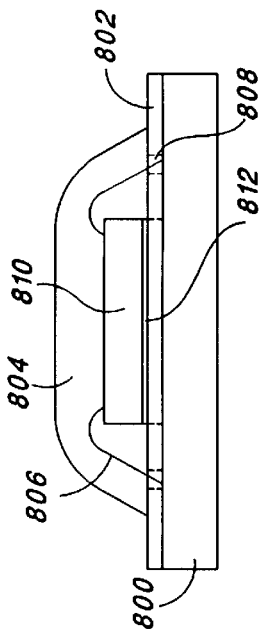
FIG. 8 is a cross-sectional view of a semiconductor package according to yet a further embodiment of the invention.

FIG. 8 shows a semiconductor package made according to a further embodiment of the invention. In this embodiment, a ceramic package substrate 800, is first provided with a diamond layer coating 802 by one of the processes described above, such as CVD deposition. Openings 808 are created in the diamond layer 802 to permit contact between the bond wires 806 and conductive traces formed on the ceramic package substrate 800. In one embodiment, such openings are etched through the diamond layer using techniques common in the semiconductor manufacturing arts.

After the diamond layer 802 is formed on the ceramic package substrate 800, the semiconductor die 810 is then mounted to the package with die attach material 812. Next, bond wires 806 are provided to attach bond pads on the semiconductor die 810 to conductive traces on the ceramic package substrate 800. Finally, an encapsulant 804 is placed over the semiconductor die 810. Alternately, the die 810 is attached to the substrate 800 in a flip-chip process, eliminating the need for bond wires and the encapsulant.

Although the present invention has been described with respect to the particular embodiments above, it will be understood by those of skill in the art that minor variations in form and detail are possible without departing from the scope and spirit of the present invention. All documents described herein are hereby incorporated by reference as though set forth in full.

What is claimed is:

1. A semiconductor package, comprising:
   a package substrate having a plurality of electrically conductive traces formed thereon, an upper surface and a lower surface, the lower surface having a plurality of contacts for providing electrical connection between the conductive traces formed on the package substrate and a plurality of conductive traces formed on a printed circuit board;
   a semiconductor die with an upper surface and a lower surface, the lower surface of the semiconductor die mounted to the upper surface of the package substrate, the semiconductor die having a plurality of bond pads formed thereon which are electrically connected to the conductive traces formed on the package substrate;
   a coating disposed on at least part of the upper surface of the package substrate and at least part of the upper surface of the semiconductor die, the coating comprising diamond.

2. A semiconductor package as in claim 1 wherein the coating is deposited on the package substrate by chemical vapor deposition.

3. A semiconductor package as in claim 1 wherein the coating comprises a preformed diamond structure.

4. A semiconductor package, comprising:
   a package substrate having a plurality of electrically conductive traces formed thereon, an upper surface and a lower surface, the lower surface having a plurality of contacts for providing electrical connection between the conductive traces formed on the package substrate and a plurality of conductive traces formed on a printed circuit board;
   a semiconductor die with an upper surface and a lower surface, the lower surface of the semiconductor die mounted to the upper surface of the package substrate, the semiconductor die having a plurality of bond pads formed thereon which are electrically connected to the conductive traces formed on the package substrate;

a coating disposed on at least part of the upper surface of the package substrate and at least part of the upper surface of the semiconductor die, the coating comprising diamond;

a heat sink for transferring heat away from the semiconductor die, the heat sink being attached to the diamond coating disposed on the upper surface of the package substrate.

5. A semiconductor package as in claim 4 wherein the coating is a chemical vapor deposition.

6. A semiconductor package as in claim 4 wherein the coating comprises a preformed diamond structure.

7. A semiconductor package as in claim 4 wherein the heat sink comprises a plurality of cooling fins.

* * * * *